(12) United States Patent
Naulleau et al.

(10) Patent No.: US 6,707,560 B1
(45) Date of Patent: Mar. 16, 2004

(54) DUAL-DOMAIN LATERAL SHEARING INTERFEROMETER

(75) Inventors: Patrick P. Naulleau, Oakland, CA (US); Kenneth Alan Goldberg, Berkeley, CA (US)

(73) Assignee: The Regents of the University of California, Oakland, CA (US)

(*) Notice: Subject to any disclaimer, the term of this patent is extended or adjusted under 35 U.S.C. 154(b) by 576 days.

(21) Appl. No.: 09/632,631

(22) Filed: Aug. 4, 2000

Related U.S. Application Data

(63) Continuation-in-part of application No. 09/300,539, filed on Apr. 27, 1999, now Pat. No. 6,100,978, which is a continuation of application No. 09/176,617, filed on Oct. 21, 1998, now Pat. No. 6,307,635.

(51) Int. Cl.[7] .............................................. G01B 9/02
(52) U.S. Cl. ........................................ 356/515; 356/521
(58) Field of Search .............................. 356/515, 521, 356/512, 513, 514, 520

(56) References Cited

U.S. PATENT DOCUMENTS 6,111,646 A   8/2000   Naulleau et al.

FOREIGN PATENT DOCUMENTS

WO   WO92/2099   11/1992

OTHER PUBLICATIONS

Kim S–W, et al., "Lateral–shearing Interferometer Using Square Prisms for Optical Testing of Aspheric Lenses", Measurement Science and Technology, *IOP Publishing*, Bristol, GB, vol. 9, Jul. 1998, pp. 1129–1136.

*Primary Examiner*—Frank G. Font
*Assistant Examiner*—Andrew H. Lee
(74) *Attorney, Agent, or Firm*—Fliesler Meyer LLP

(57) ABSTRACT

The phase-shifting point diffraction interferometer (PS/PDI) was developed to address the problem of at-wavelength metrology of extreme ultraviolet (EUV) optical systems. Although extremely accurate, the fact that the PS/PDI is limited to use with coherent EUV sources, such as undulator radiation, is a drawback for its widespread use. An alternative to the PS/PDI, with relaxed coherence requirements, is lateral shearing interferometry (LSI). The use of a cross-grating, carrier-frequency configuration to characterize a large-field 4x-reduction EUV lithography optic is demonstrated. The results obtained are directly compared with PS/PDI measurements. A defocused implementation of the lateral shearing interferometer in which an image-plane filter allows both phase-shifting and Fourier wavefront recovery. The two wavefront recovery methods can be combined in a dual-domain technique providing suppression of noise added by self-interference of high-frequency components in the test-optic wavefront.

24 Claims, 2 Drawing Sheets

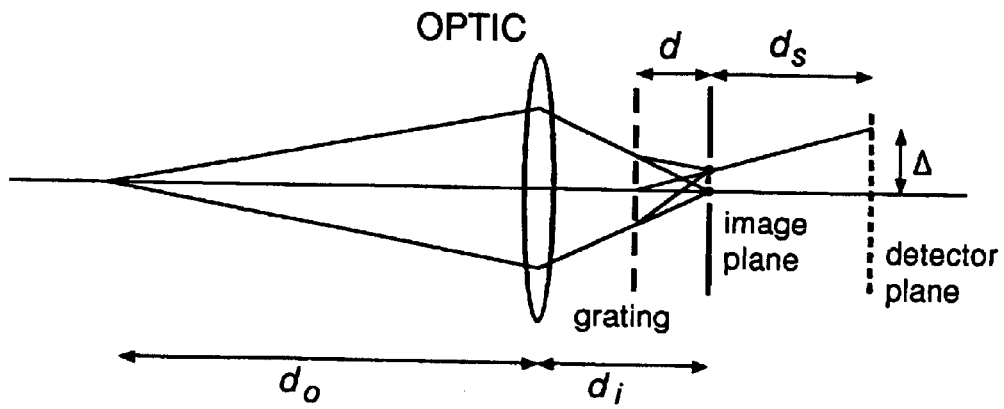
FIG._1.
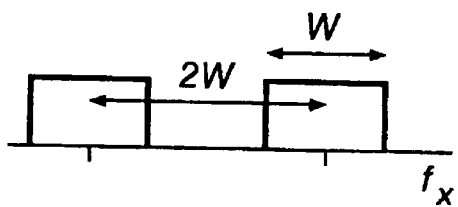
FIG._2A.
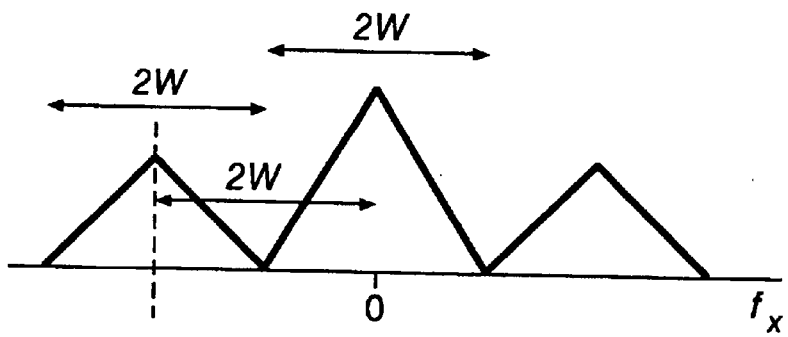
FIG._2B.

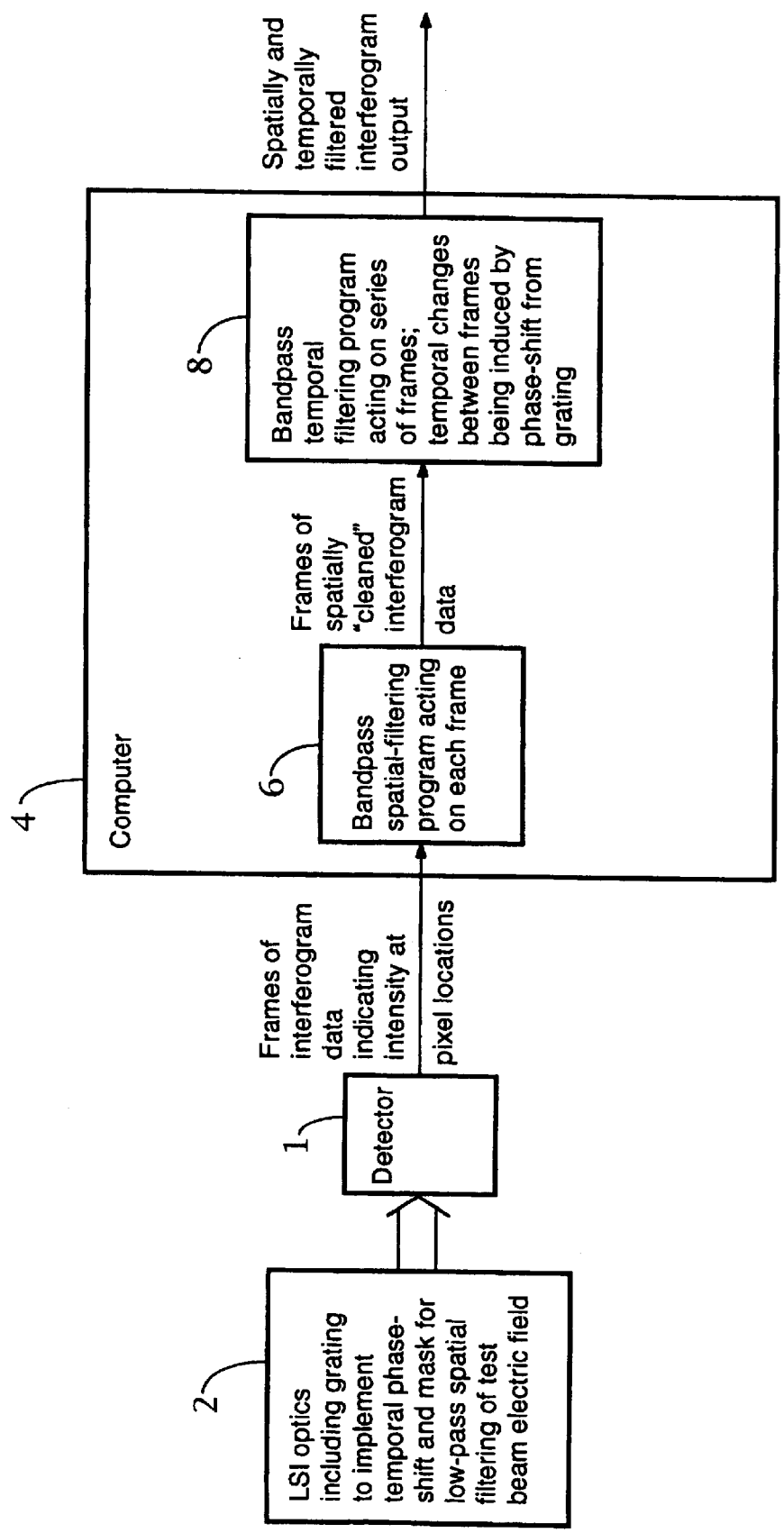
FIG._3.

DUAL-DOMAIN LATERAL SHEARING INTERFEROMETER

REFERENCE TO RELATED APPLICATION

This application is a continuation in part of U.S. Ser. No. 09/300,539, filed Apr. 27, 1999, now U.S. Pat. No. 6,100,978, which is a continuation of Ser. No. 09/176,617, filed Oct. 21, 1998, now U.S. Pat. No. 6,307,635, which is incorporated herein in its entirety.

The U.S. Government has certain rights in this invention pursuant to Contract No. DE-AC03-76SF00098 between the United States Department of Energy and the University of California for the operation of the Lawrence Berkeley National Laboratory.

FIELD OF THE INVENTION

The present invention relates to lateral shearing interferometers (LSI) for making highly accurate measurements of wavefront aberrations. The invention overcomes the inaccuracies associated with conventional implementations of grating-based LSIs.

References

The following publications are cited in this application as superscript numbers:

1. G. E. Sommargren, "Diffraction methods raise interferometer accuracy," Laser Focus World, 32, 61–71, (8/96).
2. A. K. Ray-Chaudhuri, et al, "Alignment of a multilayer-coated imaging system using extreme ultraviolet Foucault and Ronchi interferometric testing," J. Vac Sci Technol. B, 13, 3089–3093 (1995).
3. H. Medecki, et al, "Phase-shifting point diffraction interferometer," Opt. Lett., 21, 1526–1528 (1996).
4. P. Naulleau et al, "Characterization of the accuracy of EUV phase-shifting point diffraction interferometry," in *Emerging Lithographic Technologies II*, Yuli Vladimirski, Editor, Proceedings of SPIE Vol. 3331, 114–123, (1998).
5. P. Carre, "Installation et utilisation du comparateur photoelectric et interferential du bureau international des poids et mesures," Metrologia, 2, 13–17 (1966).
6. R. Crane, "Interference phase measurement," Appl. Opt., 8, 538–542 (1969).
7. J. H. Bruning, et al, "Digital wavefront measuring interferometer for testing optical surfaces and lenses," Appl. Opt., 13, 2693–2703 (1974).
8. M. Takeda, et al, "Fourier-transform method of fringe-pattern analysis for computer-based topography and interferometry," J. Opt. Soc. Am., 72, 156–160 (1982).
9. E. Leith, et al, "Electronic holography and speckle methods for imaging through tissue using femtosecond gated pulses," Appl. Opt., 30, 4204–4210 (1991).
10. K. A. Goldberg, et al, "A 3-D numerical study of pinhole diffraction to predict the accuracy of EUV point diffraction interferometry," OSA Trends in Optics and Photonics Vol. 4, Extreme Ultraviolet Lithography, G. D. Kubiac and D. R. Kania, eds, (Optical Society of America, Washington, D.C. 1996), pp. 133–137.
11. D. A. Tichenor, et al, "Development and characterization of a 10× Schwarzschild system for SXPL," in *OSA Proceedings on Soft X-Ray Projection Lithography*, Vol. 18, A. M. Hawryluk and R. H. Stulen, eds., (Optical Society of America, Washington, D.C., 1993), pp. 79–82.
12. P. de Groot, "Derivation of algorithms for phase-shifting interferometry using the concept of a data-sampling window," Appl. Opt., 34, 4723–4730 (1995).
13. K. Freischlad and C. Koliopoulos, "Fourier description of digital phase-measuring interferometry," J. Opt. Soc. Am. A, 7, 542–551 (1990).
14. Y. Surrel, "Design algorithms for phase measurements by the use of phase stepping," Appl. Opt., 35, 51–60 (1996).
15. J. Tome and H. Stahl, "Phase-measuring interferometry: applications and techniques," in *Optical Testing and Metrology II*, Proceedings of SPIE Vol. 954, 71–77 (1988).
16. K. Creath, "Comparison of phase-measuring algorithms" in *Surface Characterization and Testing*, Proceedings of SPIE Vol. 680, 19–28 (1986).
17. H. Stahl, "Review of phase-measuring interferometry," in *Optical Testing and Metrology III: Recent Advances in Industrial Optical Inspection*, Proceedings of SPIE Vol. 1332, 71–77 (1990).
18. J. E. Bjorkholm, et al., "Phase-measuring interferometry using extreme ultraviolet radiation," J. Vac. Sci. & Technol. B, 13, 2919–2922 (1995).
19. P. Naulleau, et al., "The EUV phase-shifting point diffraction interferometer: a sub-angstrom reference-wave accuracy wave front metrology tool," Appl. Opt., 38, 7252–7263 (1999).
20. K. A. Goldberg, "Extreme Ultraviolet Interferometry," Ph.D. dissertation (University of California, Berkeley, 1997).
21. D. Attwood, et al., "Tunable coherent radiation in the soft X-ray and extreme ultraviolet spectral regions," IEEE J. Quantum Electron., 35, 709–720 (1999).
22. V. Ronchi, "Forty years of history of a grating interferometer," Appl. Opt., 3, 437–451 (1964).
23. A. Lohmann and O. Bryngdahl, "A lateral wavefront shearing interferometer with variable shear," Appl. Opt., 6, 1934–1937 (1967).
24. S. Yokozeki and T. Suzuki, "Shearing interferometer using the grating as the beam splitter," Appl. Opt., 10, 1575–1580 (1971).
25. J. C. Wyant, "Double frequency grating lateral shear interferometer," Appl. Opt., 12, 2057–2060 (1973).
26. H. O. Bartlett and Yajun Li, "Lau interferometry with cross gratings," Optics Comm., 48, 1–6 (1983).
27. J. C. Wyant, "Use of an ac heterodyne lateral shear interferometer with real-time wavefront correction systems," Appl. Opt., 14, 2622–2626 (1975).
28. J. Schwider, "Single sideband Ronchi test," Appl. Opt., 20, 2635–2642 (1981).
29. J. Braat and A. Janssen, "Improved Ronchi test with extended source," J. Opt. Soc. Am. A, 16, 131–140 (1999).
30. P. Naulleau and K. A. Goldberg, "Dual-domain point diffraction interferometer," Appl. Opt, 38, 3523–3533 (1999).
31. D. Malacara, *Optical Shop Testing*, (John Wiley & Sons, New York, 1992), pp. 346–348.
32. D. W. Sweeney, et al., "EUV optical design for a 100 nm CD m imaging system," in *Emerging Lithographic Technologies II*, Y. Vladimirsky, ed., Proc. SPIE Vol. 3331, 2–10 (1998).
33. M. P. Rimmer, "Method for evaluating lateral shearing interferograms," Appl. Opt., 13, 623–629 (1974).

All of the above publications are herein incorporated by reference in their entirety to the same extent as if each individual publication was specifically and individually indicated to be incorporated by reference in its entirety.

BACKGROUND OF THE INVENTION

The recent development of extreme ultraviolet (EUV) optics for use in next-generation lithography systems has led to several advancements in EUV interferometry.[2,3,18] With a demonstrated reference-wavefront accuracy of better than $\lambda_{EUV}/350$ (0.04 nm at $\lambda_{EUV}=13.4$ nm)[19], the phase-shifting point diffraction interferometer (PS/PDI)[3,19,20] is believed to be the most accurate EUV interferometer available. Although the PS/PDI has been proven to have high-accuracy, broad applicability of the PS/PDI is severely limited by its small dynamic range and the fact that it must be used with a highly coherent EUV source such as undulator radiation.

An alternative to the PS/PDI, with relaxed coherence requirements, is the lateral shearing interferometer (LSI).[22-29] The Ronchi interferometer[22] is perhaps the simplest realization of the LSI. Although not yet fully characterized for accuracy at EUV, this type of interferometer has previously been used for at-wavelength characterization of EUV optics.[2, 18] More recently, a carrier-frequency (off-axis) implementation of the Ronchi interferometer has been used in the characterization of an EUV Schwarzschild objective. Direct comparison of this carrier-frequency LSI to the PS/PDI has demonstrated a rms measurement agreement of $\sim\lambda_{EUV}/70$. However, the development of next-generation EUV lithography systems requires interferometry with accuracy preferably far exceeding $\lambda_{EUV}/100$.

A problem with the conventional Ronchi interferometer is that it produces many interfering beams causing confusion in the data analysis and limiting the accuracy of the device. Another problem with this simple interferometer, limiting its accuracy, is that it is susceptible to noise added by high-frequency components in the test-optic wavefront.

Various methods have been described to overcome the limitation caused by multiple interfering beams. One particularly simple and elegant solution is the single-sideband LSI.[28] In operation of the single-sideband LSI, an illumination beam is spatially filtered by a pinhole in the object plane, thus illuminating the test optic with a nearly spherical wave. A grating beamsplitter is placed in front of the image plane, where the illuminating beam is focused. Two of the diffracted orders propagate through a single large window in an image-plane mask with the remainder of the diffracted orders being blocked by the mask. Typically the two orders are chosen to be the zero order and either the +1 or the −1 order. The two beams propagate to the detector where they overlap. While the zeroth-order beam propagates to the detector in the same manner as it would if the grating were not present, the diffracted order propagates with an angular shear, leading to a (typically) small lateral displacement at the detector. In this way, the test beam is compared with a sheared (laterally displaced) copy of itself.

The image-plane window serves several roles. One role is to guarantee that only two grating orders reach the detector, thus the Talbot effect of fringe w localization[31] becomes irrelevant. Without these windows the position of the grating would be limited to a discrete set of defocus planes. Another effect of having only two interfering grating orders is that the recorded fringe pattern will be sinusoidal instead of square, facilitating the fringe analysis. Finally, confusion of multiple beam interference is avoided because only two beams are allowed to interfere at the detector. In this simple two-beam interference case, analysis of the resultant interferogram reveals an approximation to the gradient of the test wavefront, or the derivative in the direction of the shear. The original wavefront can be recovered by combining gradients from two (or more) directions using a variety of well-known techniques such as the Rimmer method.[33] Although the single-sideband LSI solves the multiple-beam interference problem it does not address the issue of noise susceptibility due to high-frequency features in the test-optic wavefront.

An alternative solution to the multiple-beam interference problem is to use double-frequency gratings where only the first-diffracted orders of the two constituent gratings overlap.[25] This method, however, is not well suited to EUV interferometry due to the difficulty in fabricating the dual-high-frequency gratings. Achieving fill order separation when testing an EUV optic ($\lambda=13.4$ nm) with a moderate numerical aperture (NA) of 0.1 would require a grating pitch of 67 nm with accuracy to a small fraction of that pitch. Also it does not address the issue of noise susceptibility due to high-frequency features in the test-optic wavefront.

A third solution to the multiple-beam interference problem is ac heterodyning (phase shifting).[27,18] In this case, the grating is translated laterally, orthogonal to the grating lines, producing temporal modulation of the intensity at each pixel at the detector. Temporal filtering is used to eliminate higher-order interference terms. Achieving high accuracy with this method when square-wave gratings are used, and hence square-wave temporal modulation is produced, requires a large number of samples to be recorded with very accurate grating translation. Because EUV systems are typically limited to using square-wave (binary) gratings due to fabrication issues, this method does not provide a time-efficient solution. Again this method does not address the issue of noise susceptibility due to high-frequency features in the test-optic wavefront.

SUMMARY OF THE INVENTION

The present invention relates to a defocused implementation of the LSI in which an image-plane filter is employed to allow both phase-shifting and Fourier wavefront recovery methods to be used. Furthermore, the two wavefront recovery methods can be combined in a dual-domain technique providing suppression of noise added by self-interference of high-frequency components in the test-optic wavefront.

In one embodiment, the invention is directed to a method of generating an interference pattern with a lateral shearing interferometer that includes the steps of:

(a) directing a source of radiation toward a test optic provided in a test-optic region of the lateral shearing interferometer whereby the test optic focuses a beam of radiation to an image plane located downstream from the test optic;

(b) dividing the beam of radiation into a first output beam and a second output beam directed at different angles with respect to one another such that the first output beam impinges at a first location on the image plane and the second output beam impinges at a second location, that is laterally separated from the first location, on the image plane, wherein the first and second locations on the image plane onto which the first and second output beams impinge define a beam-separation angle;

(c) phase shifting at least one of the first output beam and the second output beam;

(d) passing the first output beam through a first window on a mask that is positioned at the image plane of the test optic to produce a first wave and passing the second output beam through a second window on the mask to produce a second wave;

(e) recording a set of interference patterns (interferograms), with relative phase shifting between each element of the set;

(f) recovering a first shearing wavefront by processing the recorded interferograms in both temporal and spatial domains;

(g) repeating steps (b) through (f) at at least one different beam-separation angle to recover at least one other shearing wavefront; and (h) combining the shearing wavefronts to recover a test-optic wavefront.

In another embodiment, the invention is directed to a lateral shearing interferometer system that defines an optical path, said system including:

(a) an optical system under test;

(b) a source of electromagnetic energy that directs a beam of radiation toward the optical system which focuses the beam of radiation;

(c) a beam divider in the optical path for dividing the beam of radiation from the optical system into a first beam and a second beam;

(d) a mask that is positioned in the image plane of the optical system under test wherein the first beam passes through a first window on the mask and the second beam through a second window on the mask, wherein the first beam and second beam are directed at different angles with respect to one another such that the first beam impinges at a first location on the image plane and the second beam impinges at a second location, laterally separated from the first location, on the image plane, wherein the first and second locations on the image plane onto which the first and second beams impinge define a beam-separation angle;

(e) a phase-shifting mechanism for adjusting the phase of at least one of the first beam or second beam;

(f) a detector located downstream from the mask for recording a set of interference patterns (interferograms), with relative phase shifts between each element of the set;

(g) means for recovering the shearing wavefront by process the recorded interferograms in both temporal and spatial domains; and (h) means for combing two or more shearing wavefronts that are measured at different beam-separation angles to recover a test-optic wavefront.

BRIEF DESCRIPTION OF THE DRAWINGS

FIG. 1 illustrates the dual-domain implementation of the lateral shearing interferometer (LSI) with image-side grating;

FIG. 2(a) depict the limits of the detector-plane-field spectral content in one dimensions as set by the image-plane spatial filter and (b) the spatial-spectrum limits of the recorded interferogram; and FIG. 3 is a diagram illustrating operation of one embodiment of the dual-domain LSI.

DETAILED DESCRIPTION OF THE PREFERRED EMBODIMENTS

In the dual-domain implementation of the LSI as illustrated in FIG. 1, the optic under test is preferably illuminated by a nearly spherical wave emanating from the object plane of the optic under test. A shearing grating is placed on the image side of the optic under test in a plane in front of the image plane. As opposed to the single-sideband method described above, the dual-domain method uses a pair of windows in the image plane aligned to selectively pass two orders of the grating.

The pair of windows in the dual-domain case serve all the same roles described for the single window in the single-sideband case: 1) eliminates the Talbot fringe localization effect,[31] 2) produces a sinusoidal fringe pattern, 3) eliminates the multiple-beam interference problem. In addition to these benefits, the dual-domain windows also act as spatial filters that prevent self-interference and aliasing corruption of the desired signal.

The desired signal is the interference between two separate orders of the grating. If the image-plane windows are too large, or a single window is used (as is the case in the single-sideband method), the spatial-frequency content of the desired signal is likely to overlap with the spatial-frequency content of the self-interference term of each individual beam. By combining the use of these windows with both phase-shifting[5-7] and Fourier-fringe analysis[8] methods this self-interference effect can be eliminated.

Another advantage of using two separate windows is that the potential aliasing problem is avoided. Aliasing occurs when the shear is larger than the smallest features of the two individual wavefronts. In this case, the shearing wavefront no longer represents the derivative of the test-optic wavefront because the signal is effectively undersampled. The two individual windows can be viewed as antialiasing filters allowing the sampling criterion to be met by limiting how small features can be in the two copies of the test-optic wavefront that actually interfere at the detector.

To eliminate the self-interference corruption, the window center-to-center W separation for the image-plane mask should be set to at least twice the window width. Furthermore, the window width should be chosen to be compatible with the spatial-frequency content expected from the optic under test. The grating position and pitch should be chosen to provide an image-plane beam separation equal to the window center-to-center separation. Finally, the grating pitch should also be selected to provide the desired detector-plane shear $\Delta$ avoiding aliasing.

In one embodiment, the LSI includes a source of radiation that precedes an object pinhole spatial-filter containing a pinhole. Moreover, the grating beam splitter (e.g, transmission grating) is placed following the test optic in a plane preceding the image plane. In the image plane is placed a two-window mask. Typically, an irradiance detector is used to record the interference patterns. Examples of irradiance detectors include a camera with a photosensitive film, and a Vidicon camera; a preferred detector is a charged-couple device (CCD). Particular features of the LSI, excluding the dual-domain features, are further described by Goldberg and Naulleau in U.S. Patent Application entitled "Hybrid Shearing and Phase-shifting Point Diffraction Interferometer" Ser. No. 09/617,719, filed Jul. 17, 2000 which is incorporated herein.

Dual-Domain Implementation for LSI

In the past, LSI data analysis had primarily been performed using either time-domain (phase-shifting) methods,[5-7, 18, 27] or spatial-domain methods such as the Fourier-transform method.[8, 28] The dual-domain LSI of the present invention, however, is well suited to using both methods and as described above, distinct advantages are obtained when the two methods are simultaneously combined.

In practice, it is difficult to strictly meet the bandwidth criterion that would prevent the self-interference corruption and aliasing problems described above. Limiting the self-interference corruption problem in the conventional single-sideband case, requires the interferogram carrier frequency to be significantly larger than the bandwidth of the test-optic wavefront. Failure to meet this criterion causes light from adjacent orders in the recorded interferogram to spill into the signal band of interest corrupting the measurement. A problem very similar to this has recently been addressed in the PS/PDI[3] through the development of a dual-domain data collection and analysis techniques.[30] This same dual-domain technique, with slight modifications of the image-plane mask, can also be applied to the LSI problem.

Derivation of the dual-domain process is described in detail by Naulleau and Goldberg in U.S. patent application Ser. No. 09/300,539 entitled "Dual-Domain Point Diffraction Interferometer" filed Apr. 27, 1999 and in "Dual-domain point diffraction interferometer," Appl. Opt, 38, 3523–3533 (1999), which are both incorporated herein by reference. The method relies on collecting a temporally modulated (phase-shifting) series of carrier-frequency interferograms. The method is essentially a three-tiered filtering system composed of lowpass spatial-filtering the test-beam electric field, bandpass spatial-filtering the individual interferogram irradiance frames of a phase-shifting series, and bandpass temporal-filtering the phase-shifting series as a whole. The first step is physical and is achieved by way of focal-plane windows, whereas the last two steps are implemented numerically. The dual-domain LSI can be viewed as a combination of the ac-heterodyne and single-sideband LSIs described above. As with the original single-sideband method, the dual-domain technique eliminates ambiguities caused by multi-beam (more than two) interference.

The dual-domain method is best described in the Fourier domain. It is assumed that the detector is in the far field of the focal plane, thus, spatial frequencies at the detector are equivalent to lateral displacements in the focal plane: $f_x \approx x/(\lambda z)$, where $f_x$ is spatial frequency in the detector plane, x is lateral displacement in the focal plane, z is the distance between the focal and detector planes, and $\lambda$ is the illumination wavelength. In the dual-domain method, a spatial filter comprised of two windows respectively centered on two diffracted orders of the grating is placed in the focal plane. The window widths are chosen small enough to prevent spatial-frequency cross-talk between adjacent orders in the recorded interferogram. This differs from the single-sideband method, which typically uses a single image-plane window to pass both orders. Typically, the first window has an area of between 1 $\mu m^2$ and 0.01 $mm^2$ and the second window has an area of between 1 $\mu m^2$ and 0.01 $mm^2$ and the separation between the center of the first window and the center of the second window is between 2 $\mu m^2$ and 0.2 $mm^2$.

Noting that the recorded interferogram is simply the modulus squared of the Fourier transform of the focal-plane field distribution, the Autocorrelation Theorem can be used to find the spatial-spectrum limits of the recorded interferogram. FIG. 2(a) depicts the limits of the detector-plane-field spectral content in one dimension as set by the image-plane spatial filter (windows) and FIG. 2(b) shows the autocorrelation of the field spectrum or the recorded intensity spectrum. The central peak is the zero-order interferogram term: this is essentially the irradiance of the light passing through the windows. The two off-axis components are the positive- and negative-first-order interferogram terms that arise from the interference between the sheared beams. To prevent overlap between adjacent orders, the window separation, and hence focal-plane beam separation is most preferably at least twice the window width. This separation differs from the PS/PDI dual-domain case where the beam separation is only required to be 3/2 the window width.[30] The difference comes from the fact that in the PS/PDI the reference-beam spectrum is essentially a delta function, whereas in the LSI, the reference is a copy of the test beam.

The condition described above guarantees that the self-interference term of the light traveling through each individual window will not corrupt the signal of interest comprised of the interference between two different orders of the grating, each propagating through a separate window. It should be noted, however, that light from a single order of the grating traveling through both windows and interfering at the detector will not be separable from the signal of interest in the spatial-frequency domain. Using the two-window mask with simple Fourier-fringe analysis would, hence, be incapable of completely eliminating the high-frequency corruption. This single-beam cross-window term, however, will not phase shift as it is arises from a single order of the grating. Phase shifting requires two different orders of the grating to interfere. The fact that this term does not phase shift while the signal of interest does, means that it can be eliminated by temporal-domain (phase-shifting) analysis. By combining the two analysis methods as is done in the dual-domain method, both major self-interference corruption terms are eliminated.

The dual-domain analysis method can be implemented in various ways. One way is to record a set of phase-shifting interferograms and to numerically spatially filter each interferogram using a Fourier-domain filter chosen to match the location and size of the first-diffracted order of each interferogram. This set of filtered interferograms is then processed using conventional phase-shifting (time-domain) methods.[5-7] The resulting wavefront is a shearing wavefront (derivative in the direction of the shear). To recover the test-optic wavefront, this process is repeated at at least one different shear direction and the shearing wavefronts combined using conventional shearing analysis methods such as the Rimmer method.[33]

Alternatively, the temporal domain (phase-shifting analysis) process can be implemented first to recover a still-partially-corrupted complex-valued shearing wavefront and the spatial filtering subsequently performed as described above to remove the residual corruption. Finally, the spatial filtering process may also be directly embedded into the phase-shifting analysis.

FIG. 3 is a diagram that illustrates the operation of one embodiment of the dual-domain LSI data collection and processing system. A detector 1 detects an interferogram produced by the optic under test 2. The interferogram changes over time as a result of the phase-shifting caused by lateral translation of the grating. The detector 1 produces an output that is sent to a computer 4. The output consists of a number of frames (at least 3) of data produced at different times. Each frame has an intensity value for each pixel of the detector.

A spatial-filtering program 6 residing in the computer 4 spatially filters each recorded frame separately as described above. The spatial-filtering program 6 produces frames of spatially "cleaned" data; the noise term arising from self-interference of light propagating through each individual window has been eliminated.

A program implementing a phase-shifting-interferometry algorithm (temporal-domain processing) 8 uses the series of "cleaned" frames to produce the wavefront output. This step simultaneously acts as a temporal filtering step, removing the self-interference noise arising from the light from a single grating order propagating through both windows.

Although only preferred embodiments of the invention are specifically disclosed and described above, it will be appreciated that many modifications and variations of the present invention are possible in light of the above teachings and within the purview of the appended claims without departing from the spirit and intended scope of the invention.

What is claimed is:

1. A method of generating an interference pattern with a lateral shearing interferometer that comprises the steps of:
   (a) directing a source of radiation toward a test optic provided in a test-optic region of the lateral shearing interferometer whereby the test optic focuses a beam of radiation to an image plane located downstream from the test optic;
   (b) dividing the beam of radiation into a first output beam and a second output beam directed at different angles with respect to one another such that the first output beam impinges at a first location on the image plane and the second output beam impinges at a second location, that is laterally separated from the first location, on the image plane, wherein the first and second locations on the image plane onto which the first and second output beams impinge define a beam-separation angle;
   (c) phase shifting at least one of the first output beam and the second output beam;
   (d) passing the first output beam through a first window on a mask that is positioned at the image plane of the test optic to produce a first wave and passing the second output beam through a second window on the mask to produce a second wave;
   (e) recording a set of interference patterns (interferograms), with relative phase shifting between each element of the set;
   (f) recovering a first shearing wavefront by processing the recorded interferograms in both temporal and spatial domains;
   (g) repeating steps (b) through (f) at at least one different beam-separation angle to recover at least one other shearing wavefront; and
   (h) combining the shearing wavefronts to recover a test-optic wavefront.

2. The method of claim 1 wherein the sizes of the first window and second window are sufficiently small to prevent spatial-frequency cross-talk between adjacent orders in the recorded interferogram.

3. The method of claim 1 wherein the separation between the center of the first window and the center of the second window is at least two times the window width.

4. The method of claim 1 wherein the first window has an area of between 1 $\mu m^2$ and 0.0 mm$^2$ and the second window has an area of between 1 $\mu m^2$ and 0.01 mm$^2$ and the separation between the center of the first window and the center of the second window is between 2 $\mu m^2$ and 0.2 mm$^2$.

5. The method of claim 4 wherein the size and shape of the first window is essentially identical to that of the second window.

6. The method of claim 1 wherein the beam divider is a diffraction grating.

7. The method of claim 1 wherein the recording device is a charged-coupled device.

8. The method of claim 1 wherein step (f) comprises (i) bandpass spatial-filtering the individual phase-shifting interferogram's irradiance frames to form a filtered phase-shifting series, and (ii) using time-domain-based techniques to recover the shearing wavefront from the resulting filtered phase-shifting series.

9. The method of claim 1 wherein step (f) comprises (i) using time-domain-based techniques to recover the complex amplitude of the shearing wavefront from the phase-shifting series as a whole, and (ii) bandpass spatial-filtering the resulting complex amplitude to eliminate the spatial-frequency crosstalk from the shearing wavefront.

10. The method of claim 8 wherein the bandpass filter, as defined in the spatial-frequency domain, is (i) essentially equal to twice the test-beam window size as defined in the spatial-frequency domain and (ii) is centered on the positive- and/or negative-first orders of the recorded interferograms.

11. The method of claim 9 wherein the bandpass filter, as defined in the spatial-frequency domain, is (i) essentially equal to twice the test-beam window size, as defined in the spatial-frequency domain, and (ii) centered on the Fourier-domain peak of the complex amplitude.

12. The method of claim 1 wherein step (f) comprises embedding a bandpass spatial-filtering process into a time-domain technique algorithm, thereby, simultaneously processing the data in both the temporal and spatial domains.

13. A lateral shearing interferometer system that defines an optical path, said system comprising:
   (a) an optical system under test;
   (b) a source of electromagnetic energy that directs a beam of radiation toward the optical system which focuses the beam of radiation;
   (c) a beam divider in the optical path for dividing the beam of radiation from the optical system into a first beam and a second beam;
   (d) a mask that is positioned in the image plane of an optical system under test wherein the first beam passes through a first window on the mask and the second beam through a second window on the mask, wherein the first beam and second beam are directed at different angles with respect to one another such that the first beam impinges at a first location on the image plane and the second beam impinges at a second location, laterally separated from the first location, on an image plane, wherein the first and second locations on the image plane onto which the first and second beams impinge define a beam separation angle;
   (e) a phase shifting mechanism for adjusting the phase of at least one of the first beam or second beam;
   (f) a detector located downstream from the mask for recording a set of interference patterns (interferograms), with relative phase shifts between each element of the set;
   (g) means for recovering shearing wavefront by processing the recorded interferograms in both temporal and spatial domains; and
   (h) means for combing two or more shearing wavefronts that are measured at different beam separation angles to recover a test-optic wavefront.

14. The system of claim 13 wherein the sizes of the first window and second window are sufficiently small to prevent spatial-frequency cross-talk between adjacent orders in the recorded interferogram.

15. The system of claim 13 wherein the separation between the center of the first window and the center of the second window is at least two times the window width.

16. The system of claim 13 wherein the first window has an area of between 1 $\mu m^2$ and 0.01 mm$^2$ and the second window has an area of between 1 $\mu m^2$ and 0.01 mm$^2$ and the separation between the center of the first window and the center of the second window is between 2 $\mu m^2$ and 0.2 mm$^2$.

17. The system of claim 15 wherein the size and shape of the first window is essentially identical to that of the second window.

18. The system of claim 13 wherein the beam divider is a diffraction grating.

19. The system of claim 13 wherein the recording device is a charged-coupled device.

20. The system of claim 13 wherein the means for recovering the shearing wavefront comprises means for (i) bandpass spatial-filtering the individual interferogram's irradiance frames to form a filtered phase-shifting series, and (ii) using time-domain-based techniques to recover the shearing wavefront from the resulting filtered phase-shifting series.

21. The system of claim 13 wherein the means for recovering the shearing wavefront comprises means for (i) using time-domain-based techniques to recover the complex amplitude of the shearing wavefront from the phase-shifting series as a whole, and (ii) bandpass spatial-filtering the resulting complex amplitude to eliminate the spatial-frequency crosstalk from the shearing wavefront.

22. The system of claim 20 wherein the means for bandpass spatial-filtering, as defined in the spatial-frequency domain, is (i) essentially equal to twice the test-beam window size as defined in the spatial-frequency domain and (ii) is centered on the positive- and/or negative-first orders of the recorded interferograms.

23. The system of claim 21 wherein the bandpass spatial-filtering means, as defined in the spatial-frequency domain, is (i) essentially equal to twice the test-beam window size, as defined in the spatial-frequency domain, and (ii) centered on the Fourier-domain peak of the complex amplitude.

24. The system of claim 13 wherein the means for recovering the shearing wavefront comprises a bandpass spatial-filtering process that is embedded into a time-domain technique algorithm, thereby, simultaneously processing the data in both the temporal and spatial domains.

* * * * *